(12) United States Patent
Kuo et al.

(10) Patent No.: US 12,376,441 B2
(45) Date of Patent: Jul. 29, 2025

(54) LIGHT-EMITTING ELEMENT

(71) Applicant: Lextar Electronics Corporation, Hsinchu (TW)

(72) Inventors: Shiou-Yi Kuo, Hsinchu (TW); Te-Chung Wang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 464 days.

(21) Appl. No.: 17/818,720

(22) Filed: Aug. 10, 2022

(65) Prior Publication Data
US 2023/0068872 A1 Mar. 2, 2023

(30) Foreign Application Priority Data
Aug. 26, 2021 (TW) .................................. 110131699

(51) Int. Cl.
*H10H 20/80* (2025.01)
*H10H 20/814* (2025.01)
*H10H 20/819* (2025.01)

(52) U.S. Cl.
CPC ...... *H10H 20/862* (2025.01); *H10H 20/8142* (2025.01); *H10H 20/819* (2025.01)

(58) Field of Classification Search
CPC .......................... H10H 20/862; H10H 20/8142
See application file for complete search history.

(56) References Cited

U.S. PATENT DOCUMENTS

| | | | |
|---|---|---|---|
| 6,420,199 B1 | 7/2002 | Coman et al. | |
| 6,969,874 B1 * | 11/2005 | Gee | H10H 20/8142 257/94 |
| 7,223,998 B2 | 5/2007 | Schwach et al. | |
| 7,332,365 B2 | 2/2008 | Nakamura et al. | |
| 7,928,471 B2 | 4/2011 | Mastro et al. | |
| 10,868,213 B2 | 12/2020 | Armitage et al. | |

(Continued)

FOREIGN PATENT DOCUMENTS

| | | |
|---|---|---|
| CN | 105609602 B | 10/2017 |
| CN | 107369746 A | 11/2017 |

(Continued)

OTHER PUBLICATIONS

K. Bergenek et al., "Directional light extraction from thin-film resonant cavity light-emitting diodes with a photonic crystal", American Institute of Physics, Applied Physics Letters 93, 231109(2008), published online Dec. 10, 2008.

*Primary Examiner* — David A Zarneke
(74) *Attorney, Agent, or Firm* — CKC & Partners Co., LLC

(57) ABSTRACT

A light-emitting element includes a first reflection layer, a second reflection layer, a multi-layer light-emitting structure, and a light-transmitting semiconductor layer. The first reflection layer has a first reflectance, and the second reflection layer has a second reflectance greater than the first reflectance. The multi-layer light-emitting structure is between the first reflection layer and the second reflection layer. The light-transmitting semiconductor layer is located on the first reflection layer and has an upper light-extracting surface, and the first reflection layer is closer to the upper light-extracting surface than the second reflection layer. An interval between the upper light-extracting surface and the first reflection layer is equal to or smaller than 5 μm.

20 Claims, 3 Drawing Sheets

(56) References Cited

U.S. PATENT DOCUMENTS

| | | |
|---|---|---|
| 10,950,583 B2 | 3/2021 | Moon et al. |
| 2018/0040665 A1 | 2/2018 | Ohmae et al. |
| 2023/0134581 A1* | 5/2023 | Liu .................. H10H 20/815 257/13 |

FOREIGN PATENT DOCUMENTS

| | | |
|---|---|---|
| CN | 109860367 A | 6/2019 |
| CN | 110581206 A | 12/2019 |
| TW | 200409378 A | 6/2004 |
| TW | 201545385 A | 12/2015 |
| WO | 2020/005827 A1 | 1/2020 |

\* cited by examiner

LIGHT-EMITTING ELEMENT

CROSS-REFERENCE TO RELATED APPLICATION

This application claims priority to Taiwan Application Serial Number 110131699, filed Aug. 26, 2021, which is herein incorporated by reference in its entirety.

BACKGROUND

Technical Field

The present disclosure relates to a light-emitting element, and particularly relates to a resonant cavity light-emitting diode.

Description of Related Art

Light-emitting diodes (LED) are solid light-emitting elements made of semiconductor materials containing III-V group compound, such as gallium phosphide, gallium arsenide, and gallium nitride. By applying a voltage to the compound semiconductor, electron holes and electrons recombine in an active layer under the voltage, and the electrons fall to a lower energy level. Therefore, the energy is transferred into photons to generate light.

SUMMARY

The disclosure provides a light-emitting element including a first reflection layer, a second reflection layer, a multi-layer light-emitting structure, and a light-transmitting semiconductor layer. The first reflection layer has a first reflectance, and the second reflection layer has a second reflectance greater than the first reflectance. The multi-layer light-emitting structure is between the first reflection layer and the second reflection layer. The light-transmitting semiconductor layer is located on the first reflection layer and has an upper light-extracting surface, and the first reflection layer is closer to the upper light-extracting surface than the second reflection layer. An interval between the upper light-extracting surface and the first reflection layer is equal to or smaller than 5 µm.

In embodiments of the present invention, a light-emitting element has a resonant cavity formed collectively by first and second reflective layers having different reflectance such that the front light generated by the light-emitting element outputs in convergence from a light-extracting surface thereof. Therefore, the light generated by the light-emitting element has a consistent wavelength, intensive front light output, and a small light-emitting angle.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
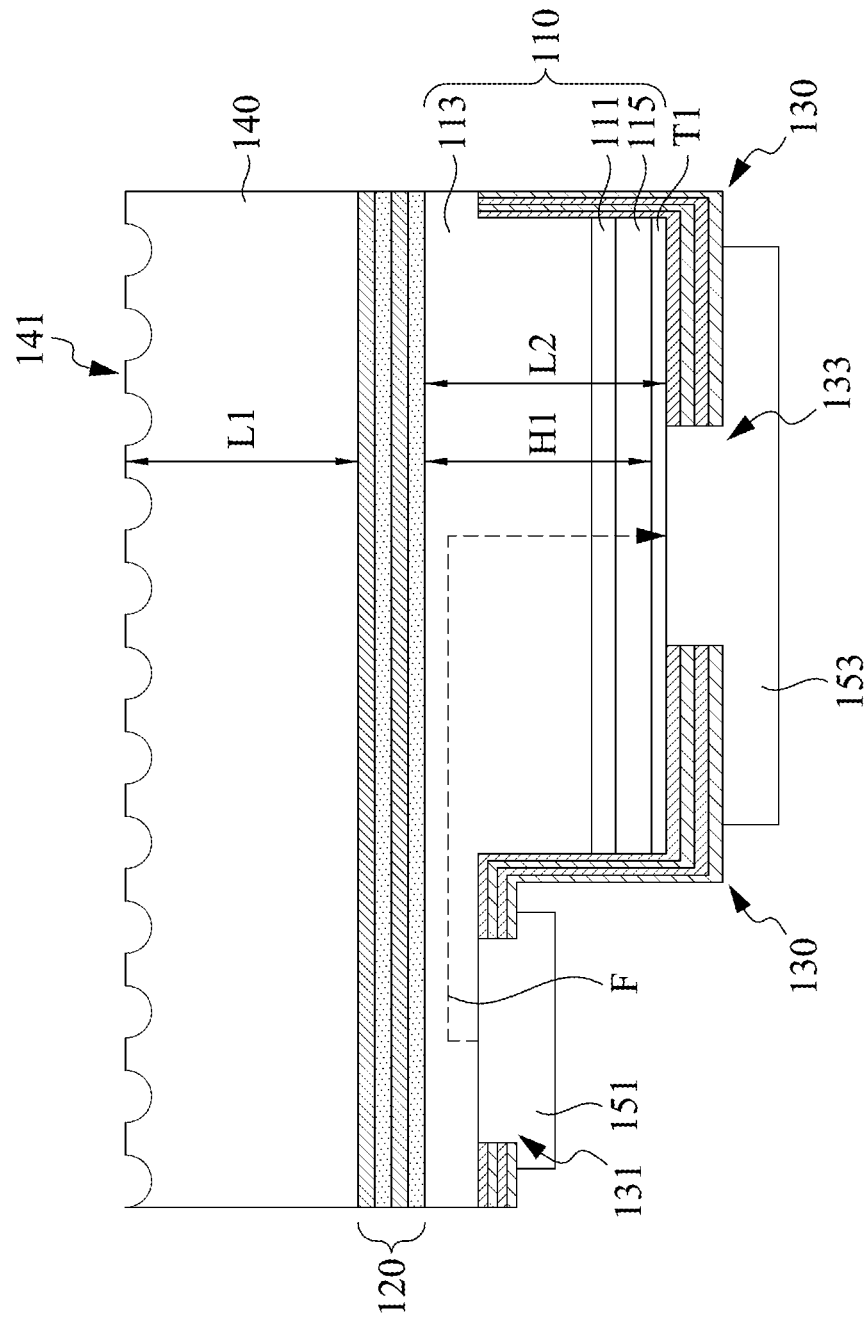
FIG. 1 illustrates a cross-sectional view of a light-emitting element in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 illustrates a cross-sectional view of a light-emitting element 100. The light-emitting element 100 includes a multi-layer light-emitting structure 110, a first reflection layer 120, a second reflection layer 130, and a light-transmitting semiconductor layer 140. The multi-layer light-emitting structure 110 is disposed between the first reflection layer 120 and the second reflection layer 130. The first reflection layer 120 has a first reflectance, and the second reflection layer 130 has a second reflectance, in which the second reflectance is greater than the first reflectance. The light-transmitting semiconductor layer 140 which is disposed on the first reflection layer 120 has an upper light-extracting surface 141, in which the first reflection layer 120 is closer to the upper light-extracting surface 141 than the second reflection layer 130. A first interval L1 between the upper light-extracting surface 141 and the first reflection layer 120 is smaller than or equal to 5 µm, and the first interval L1 is greater than 0 µm. The first interval L1 is a maximum vertical distance between the light-extracting surface 141 and a top surface of the first reflection layer 120. The first interval L1 is measured along a direction perpendicular to the top surface of the first reflection layer 120. The light-emitting element 100 uses the first reflection layer 120 and the second reflection layer 130 with different reflectance to form a resonant cavity such that light generated by the multi-layer light-emitting structure 110 passes through the upper light-extracting surface 141 and moves outward. Therefore, the generated light of the light-emitting element 100 has a consistent wavelength, intensive front light output, and a small light-emitting angle. In addition, the first interval L1 between the upper light-extracting surface 141 and the first reflection layer 120 is greater than 0 µm and smaller than 5 µm, so the light generated by the light-emitting element 100 can be prevented from being reflected too many times and diverging. Moreover, the light generated by the light-emitting element 100 is further concentrated, so as to obtain the convergent light and enhance the front light output.

Specifically, the light-emitting element 100 includes a mini light-emitting diode (mini LED) or a micro light-emitting diode (micro LED), and the present disclosure is not limited in this respect. The multi-layer light-emitting structure 110 includes an active layer 111, an n-type semiconductor layer 113, and a p-type semiconductor layer 115, in which the active layer 111 is disposed between the n-type semiconductor layer 113 and the p-type semiconductor layer 115. The active layer 111 can include a multiple quantum well (MQW), a single quantum well, (SQW), a homojunction, a heterojunction, or a similar structure. The present disclosure is not limited in this respect.

In some embodiments of the present disclosure, the n-type semiconductor layer 113 and the p-type semiconductor layer 115 include a III-V compound semiconductor material. For instance, the III-V compound semiconductor includes binary epitaxial material, such as gallium arsenide (GaAs), gallium nitride (GaN), gallium phosphide (GaP), and indium arsenide (InAs); ternary epitaxial material, such as gallium arsenide phosphide (GaAsP), gallium aluminium arsenide (AlGaAs), indium gallium phosphide (InGaP), indium gallium nitride (InGaN), and quaternary epitaxial material, such as aluminium gallium indium phosphide (AlInGaP), or gallium indium arsenide phosphide (InGaAsP). The n-type semiconductor layer 113 can be formed by doping a IV A group element such as silicon to the aforementioned III-V compound semiconductor material, and the p-type semiconductor layer 115 can also be formed by doping a II A group element, such as beryllium (Be), magnesium (Mg), calcium (Ca), and strontium (Sr). The present disclosure is not limited in this respect.

In some embodiments of the present disclosure, the first reflection layer 120 includes a Distributed Bragg Reflector (DBR) containing a semiconductor material, and the light generated by the multi-layer light-emitting structure 110 partially passes the first reflection layer 120. The first reflection layer 120 can be formed by alternately stacking films with two homogeneous or heterogeneous materials which have different reflectance. Moreover, the first reflection layer 120 can be made by alternately stacking two or more materials selected from a group containing aluminum gallium nitride (AlGaN), gallium nitride (GaN), aluminum nitride (AlN), indium gallium nitride (InGaN), aluminum arsenide (AlAs), aluminum gallium arsenide (AlGaAs), gallium phosphide (GaP), aluminium indium phosphide (AlInP) and aluminium gallium indium phosphide (AlInGaP). The second reflection layer 130 includes a dielectric Distributed Bragg Reflector (DBR), and the second reflection layer 130 can be formed by alternately stacking two or more materials selected from a group containing zinc selenide (ZnSe), magnesium fluoride ($MgF_2$), silicon (Si), silicon nitride ($SiN_x$), titanium dioxide ($TiO_2$), tantalum pentoxide ($Ta_2O_5$), hafnium oxide ($HfO_2$), silicon dioxide ($SiO_2$), zirconium dioxide (ZrO2), and aluminium oxide ($Al_2O_3$). The present disclosure is not limited in this respect.

In some embodiments of the present disclosure, the first reflectance of the first reflection layer 120 ranges from 45% to 95%, and the second reflectance of the second reflection layer 130 is greater than 95%. A second interval L2 between the first reflection layer 120 and the second reflection layer 130 is smaller than or equal to 3 μm, and the second interval L2 is greater than 0 μm, so as to form a resonant cavity to reflect the light generated by the multi-layer light-emitting structure 110. The second interval L2 is a maximum vertical distance between a bottom surface of the first reflection layer 120 and a top surface of the second reflection layer 130. The second interval L2 is measured along a vertical direction perpendicular to the bottom surface of the first reflection layer 120. By performing an epitaxial process, the second interval L2 can be well-controlled to be smaller than or equal to 3 μm, and the second interval L2 is greater than 0 μm, so as to form a resonant cavity having a small cavity length and make sure that light emitted from the resonant cavity has a consistent wavelength. The present disclosure is not limited in this respect. Therefore, by adjusting the related positions of the first reflection layer 120 and the second reflection layer 130 well such as adjusting the second interval L2, the light-emitting element 100 can generate light having a narrow full width at half maximum (FWHM). Therefore, the color gamut of the light is improved, and thus the light-emitting element 100 is suitable for display device such as display screen.

In some embodiments of the present disclosure, a ratio of a maximum vertical length H1 of the multi-layer light-emitting structure 110 to the second interval L2 is greater than or equal to 0.9, and the ratio is smaller than 1. The maximum vertical length H1 is measured along the same direction as the first interval L1 and the second intervals L2. The aforementioned ratio range means that the majority of the height of the resonant cavity is basically determined by the multi-layer light-emitting structure 110. Therefore, a height of the resonant cavity can be controlled well by a semiconductor epitaxial growth process, so the light-emitting angle of the light-emitting element 100 is decreased. In addition, a transparent bonding layer T1 is in direct contact with and disposed between the multi-layer light-emitting structure 110 and the second reflection layer 130, and the transparent bonding layer T1 can be made of one of indium tin oxide (ITO), zinc oxide (ZnO), aluminum-doped zinc oxide (AZO), tin oxide ($SnO_2$), indium oxide ($In_2O_3$), graphene, and zinc tin oxide (ZTO). The present disclosure is not limited in this respect.

In some embodiments of the present disclosure, the light-transmitting semiconductor layer 140 includes a same material as the multi-layer light-emitting structure 110 or a different material different from the multi-layer light-emitting structure 110. The light-transmitting semiconductor layer 140 can include an undoped III-V compound semiconductor, a III-V compound semiconductor doped with IV A group element such as silicon, or both of the undoped III-V compound semiconductor and the III-V compound semiconductor doped with IV A group element. The present disclosure is not limited in this respect. The III-V compound semiconductor has been introduced in the previous paragraphs, and the related information thereof is not repeated.

In some embodiments of the present disclosure, the multi-layer light-emitting structure 110, the first reflection layer 120, and the light-transmitting semiconductor layer 140 can be formed by an epitaxial growth process, such as metal organic chemical vapor deposition (MOCVD), molecular beam epitaxy (MBE), hydride vapour phase epitaxy (HVPE), liquid phase epitaxy (LPE), or any suitable chemical vapor deposition, and the epitaxial growth process can control thicknesses of the multi-layer light-emitting structure 110 well, the first reflection layer 120, and the light-transmitting semiconductor layer 140. In addition, the second reflection layer 130 can be conformally formed on the multi-layer light-emitting structure 110 by an E-beam evaporator or plasma enhanced chemical vapor deposition (PECVD).

In some embodiments of the present disclosure, the light-emitting element 100 includes a first conductive pad 151 and a second conductive pad 153, and the active layer 111 is disposed between the n-type semiconductor layer 113 and the p-type semiconductor layer 115. The n-type semiconductor layer 113 is disposed between the p-type semiconductor layer 115 and the first reflection layer 120, in which the first conductive pad 151 is electrically connected to the n-type semiconductor layer 113, and the second conductive pad 153 is electrically connected to the p-type semiconductor layer 115. The first conductive pad 151, the second conductive pad 153, and the second reflection layer 130 are disposed on the same side of the first reflection layer 120. Therefore, a current flow F from the first conductive pad 151 to the second conductive pad 153 is not negatively affected by the first reflection layer 120 which has high resistance, and the current flow F can efficiently excite the multi-layer light-emitting structure 110 to generate light. Specifically, the first conductive pad 151 is in direct contact with the n-type semiconductor layer 113, and the second conductive pad 153 is in direct contact with the transparent bonding layer T1 to be electrically connected to the p-type semiconductor layer 115. The present disclosure is not limited in this respect. In addition, the first conductive pad 151 is disposed in a first opening 131 of the second reflection layer 130, and the second conductive pad 153 is disposed in a second opening 133 of the second reflection layer 130. Therefore, the first conductive pad 151 and the second conductive pad 153 extend through the second reflection layer 130, and the second reflection layer 130 separates and electrically insulates the first conductive pad 151 from the second conductive pad 153.

In some embodiments of the present disclosure, the first conductive pad 151 and the second conductive pad 153 include one material selected from a group containing indium (In), tin (Sn), aluminium (Al), gold (Au), platinum (Pt), zinc (Zn), germanium (Ge), silver (Ag), lead (Pb), palladium (Pd), copper (Cu), gold beryllium (AuBe), gold germanium (AuGe), nickel (Ni), lead tin (PbSn), chromium (Cr), gold tin (AuSn), titanium (Ti), tungsten (W), and titanium tungsten (TiW). In addition, the first conductive pad 151 and the second conductive pad 153 can be formed by physical vapor deposition (PVD), sputter, E-Gun evaporation, chemical vapor deposition (CVD), atomic layer deposition (ALD), or any suitable method. The present disclosure is not limited in this respect.

In some embodiments of the present disclosure, the upper light-extracting surface 141 of the light-transmitting semiconductor layer 140 includes a corrugated surface, and the corrugated surface has alternately arranged concave and convex portions which are regular arranged or irregular arranged. In practice, the light-transmitting semiconductor layer 140 can be formed on a substrate (not shown) to manufacture the light-emitting element 100, and the substrate can be a sapphire substrate or any suitable substrate. After the light-emitting element 100 is formed, a laser lift-off process (LLO), a polishing process, or an etching process can be used to separate the light-emitting element 100 from the substrate, so as to form the corrugated upper light-extracting surface 141.

In comparison with a normal chip which has a substrate, such as a face up chip, a flip chip, or a vertical chip of a light-emitting element, the substrate (not shown) of the light-emitting element 100 is removed, so the light-emitting element 100 has a small light-emitting angle. In some cases, the light-emitting element 100 includes a half-intensity angle smaller than 110 degrees. Generally, bonding wires are disposed on a light-extracting surface of the face up chip or the vertical chip. For instance, the face up chip generally has two bonding wires, and the vertical chip generally has one bonding wire. However, the boding wires which would block light are harmful to the miniaturization development of the light-emitting element. In addition, a light-extracting surface of the flip chip are disposed on an original thick substrate for forming the chip structure, and thus the flip chip of the light-emitting element has a large light-emitting angle such as half-intensity angle greater than 140 degrees, so as to cause low light emitting efficiency which is not suitable for display device.

Figure 2:
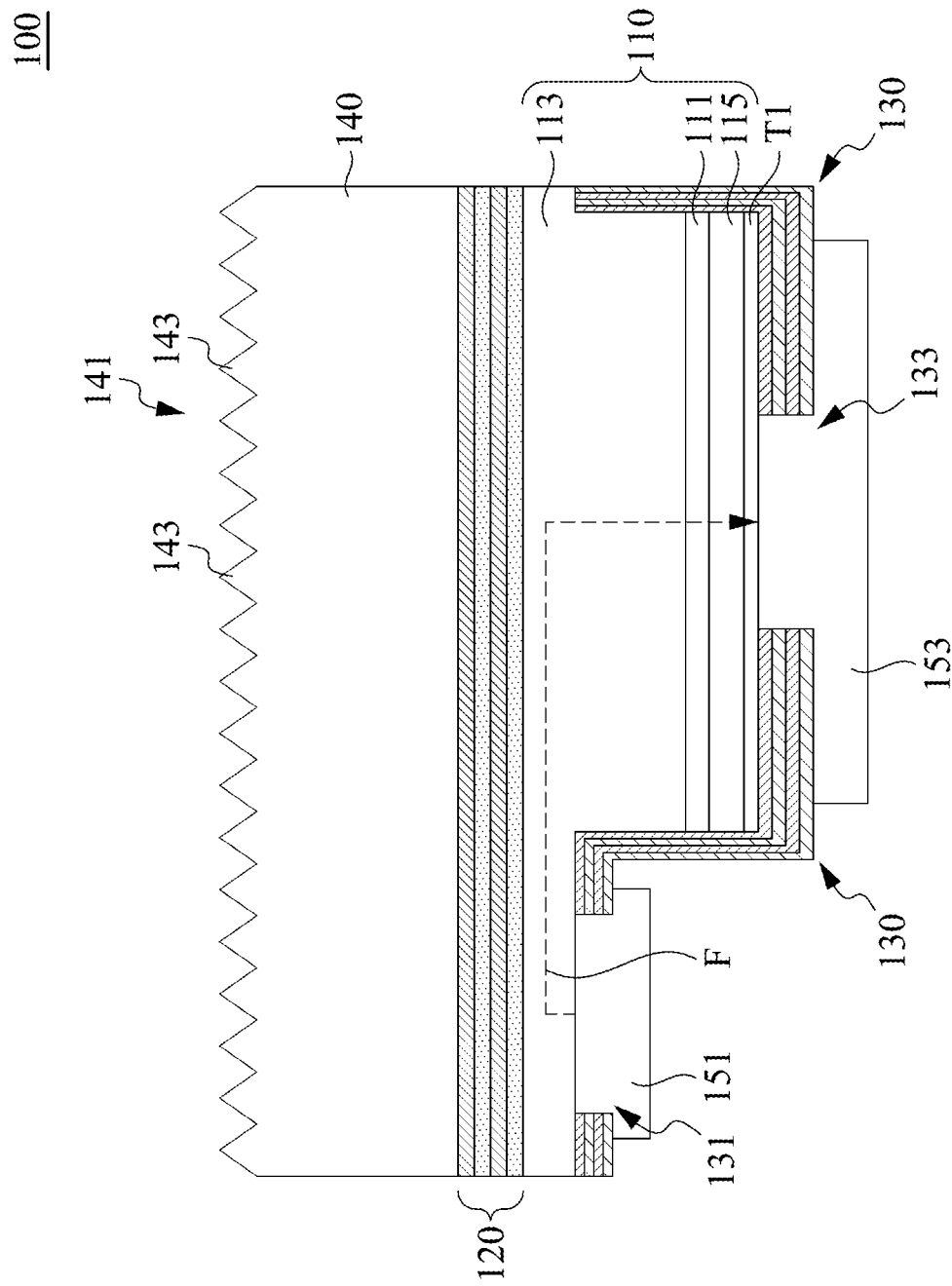
FIG. 2 illustrates a cross-sectional view of a light-emitting element in accordance with some embodiments of the present disclosure.

Reference is made to FIG. 2, which illustrates a cross-sectional view of the light-emitting element 100 in accordance with some embodiments of the present disclosure. After the substrate (not shown) is removed, an etching process is performed to the upper light-extracting surface 141 of the light-transmitting semiconductor layer 140, such as isotropic etching process and anisotropic etching process, so as to form a plurality of cone-shaped top portions 143 which can efficiently concentrate the light generated by the multi-layer light-emitting structure 110.

Figure 3:
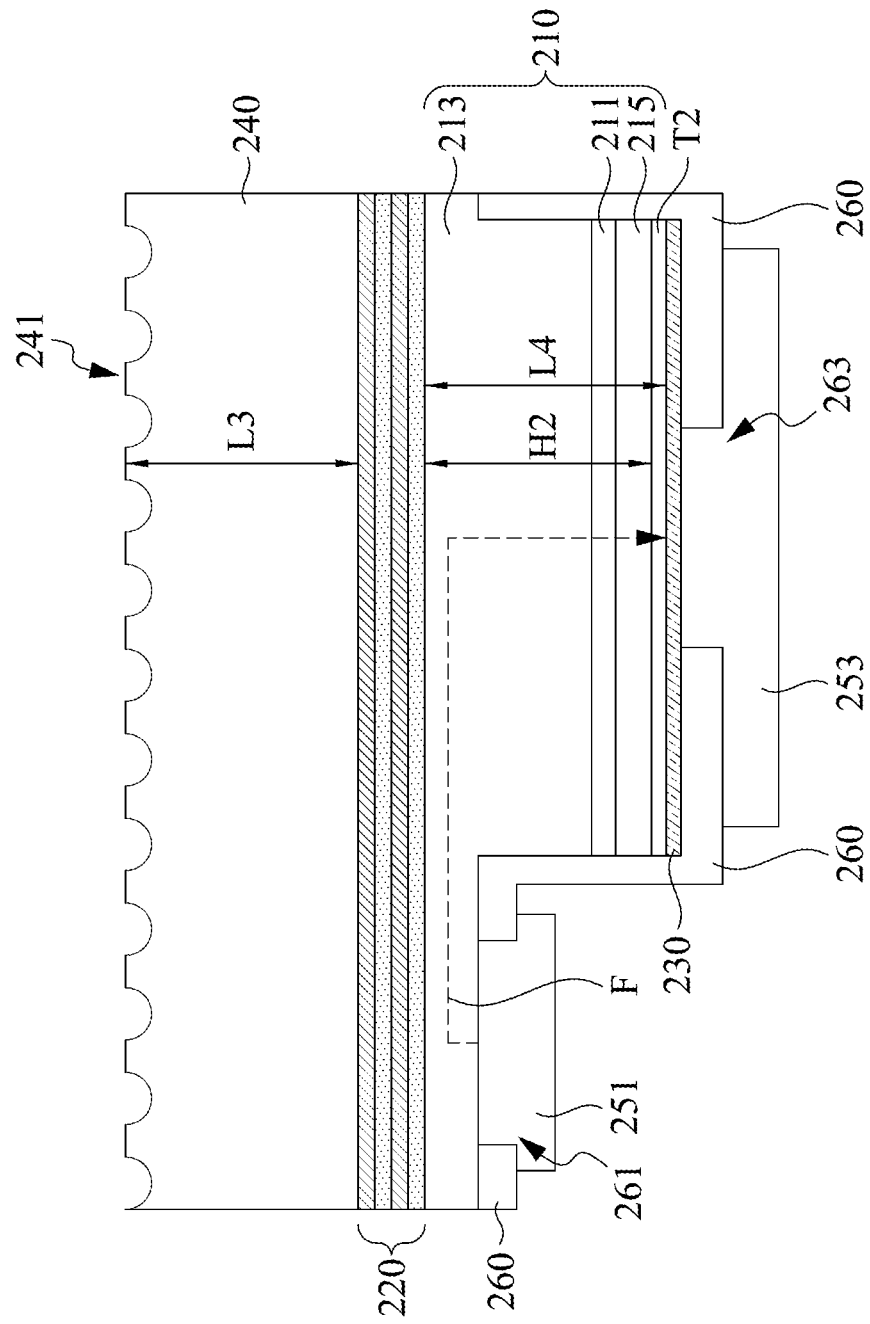
FIG. 3 illustrates a cross-sectional view of a light-emitting element in accordance with some embodiments of the present disclosure.

Reference is made to FIG. 3, which illustrates a cross-sectional view of the light-emitting element 200 in accordance with some embodiments of the present disclosure. The light-emitting element 200 incudes a multi-layer light-emitting structure 210, a first reflection layer 220, a second reflection layer 230, and a light-transmitting semiconductor layer 240. The multi-layer light-emitting structure 210 is disposed between the first reflection layer 220 and the second reflection layer 230. The first reflection layer 220 has a first reflectance, and the second reflection layer 230 has a second reflectance, in which the second reflectance is greater than the first reflectance. In addition, the light-transmitting semiconductor layer 240 is disposed on the first reflection layer 220 and has an upper light-extracting surface 241, in which the first reflection layer 220 is closer to the upper light-extracting surface 241 than the second reflection layer 230. A first interval L3 between the upper light-extracting surface 241 and the first reflection layer 220 is smaller than or equal to 5 μm, and the first interval L3 is greater than 0 μm. The first interval L3 is a maximum vertical distance between the upper light-extracting surface 241 and a top surface of the first reflection layer 220. The first interval L3 is measured along a direction perpendicular to the top surface of the first reflection layer 120. A major difference between the light-emitting element 100 and the light-emitting element 200 is that the second reflection layer 230 of the light-emitting element 200 is a metal mirror, so there are some structural details need to be adjusted. The light-emitting element 100 and the light-emitting element 200 substantially use same materials, and the same information thereof is not repeated.

Specifically, the second reflection layer 230 is formed as a single-layer structure or a multilayer structure which includes at least one material selected from a group containing indium (In), tin (Sn), aluminium (Al), gold (Au), platinum (Pt), zinc (Zn), germanium (Ge), silver (Ag), lead (Pb), palladium (Pd), copper (Cu), gold beryllium (AuBe), gold germanium (AuGe), nickel (Ni), lead tin (PbSn), chromium (Cr), gold tin (AuSn), titanium (Ti), tungsten (W), and titanium tungsten (TiW). In addition, the second reflection layer 230 can be manufactured by plating, physical vapor deposition (PVD), sputtering, E-Gun evaporation, chemical vapor deposition (CVD), atomic layer deposition (ALD), or any suitable method. The present disclosure is not limited in this respect.

In some embodiments of the present disclosure, a second interval L4 between the first reflection layer 220 and the second reflection layer 230 is smaller than or equal to 3 μm, and the second interval L4 is greater than 0 μm. The second interval L4 is a distance measured along a vertical direction perpendicular to a bottom surface of the first reflection layer 220. The maximum vertical length H2 is measured along the same direction as the first interval L3 and the second intervals L4. When the second interval L4 is smaller than or equal to 3 μm, the generated light has a consistent wavelength. In addition, a ratio of a maximum vertical height H2 of the multi-layer light-emitting structure 210 to the second interval L4 is greater than or equal to 0.9, and the ratio is smaller than 1. The present disclosure is not limited in this respect.

In some embodiments of the present disclosure, the multi-layer light-emitting structure 210 includes an active layer 211, an n-type semiconductor layer 213, a p-type semiconductor layer 215, and a transparent bonding layer T2. The transparent bonding layer T2 is disposed between the multi-layer light-emitting structure 210 and the second reflection layer 230, and the active layer 211 is disposed between the n-type semiconductor layer 213 and the p-type semiconductor layer 215. Specifically, the transparent bonding layer T2 is in direct contact with and disposed between the p-type semiconductor layer 215 and the second reflection layer 230, and the transparent bonding layer T2 is benefit for the electrical connection between the p-type semiconductor layer 215 and the second reflection layer 230 such that a current flow F can efficiently pass through the active layer 211 to generate the light.

In some embodiments of the present disclosure, the light-emitting element 200 further includes a passivation layer 260 which surrounds the multi-layer light-emitting structure 210, the second reflection layer 230, and the transparent bonding layer T2. The passivation layer 260 is configured to separate and electrically insulate a first conductive pad 251 of the light-emitting element 200 from a second conductive pad 253. The first conductive pad 251 is disposed in a first opening 261 of the passivation layer 260, and the second conductive pad 253 is disposed in a second opening 263 of the passivation layer 260. The first conductive pad 251 which extends through the passivation layer 260 is electrically connected to the n-type semiconductor layer 213, and the second conductive pad 253 which extends through the passivation layer 260 is electrically connected to the p-type semiconductor layer 215. Specifically, the passivation layer 260 includes a dielectric material such as silicon dioxide ($SiO_2$) and silicon nitride ($Si_3N_4$). The first conductive pad 251 is in direct contact with the n-type semiconductor layer 213, and the second conductive pad 253 is in direct contact with the second reflection layer 230. In addition, the second reflection layer 230, the first conductive pad 251, and the second conductive pad 253 are disposed on the same side of the first reflection layer 220 such that the current flow F from the first conductive pad 251 to the second conductive pad 253 is not affected by the first reflection layer 220 which has high resistance. Therefore, the current flow F can efficiently excite the multi-layer light-emitting structure 210 to generate light.

In embodiments of the present disclosure, a light-emitting element has a resonant cavity formed collectively by first and second reflective layers having different reflectance such that the front light generated by the light-emitting element outputs in convergence from a light-extracting surface thereof. Therefore, the light generated by the light-emitting element has a consistent wavelength, intensive front light output, and a small light-emitting angle.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting element, comprising:
   a first reflection layer having a first reflectance;
   a second reflection layer having a second reflectance greater than the first reflectance;
   a multi-layer light-emitting structure disposed between the first reflection layer and the second reflection layer; and
   a light-transmitting semiconductor layer disposed on the first reflection layer and having an upper light-extracting surface, wherein the first reflection layer is closer to the upper light-extracting surface than the second reflection layer, and wherein an interval between the upper light-extracting surface and the first reflection layer is equal to or smaller than 5 μm.

2. The light-emitting element of claim 1, wherein an interval between the first and second reflection layers is equal to or smaller than 3 μm.

3. The light-emitting element of claim 1, wherein a ratio of a maximum vertical length of the multi-layer light-emitting structure to an interval between the first and second reflection layers is equal to or greater than 0.9, and the ratio is smaller than 1.

4. The light-emitting element of claim 1, wherein the second reflectance is greater than 95%, and the first reflectance ranges from 45% to 95%.

5. The light-emitting element of claim 1, wherein the second reflection layer comprises a Bragg reflector.

6. The light-emitting element of claim 5, wherein the first reflection layer comprises another Bragg reflector containing semiconductor material.

7. The light-emitting element of claim 1, wherein the second reflection layer comprises a metal reflection mirror.

8. The light-emitting element of claim 7, wherein the first reflection layer comprises a Bragg reflector containing semiconductor material.

9. The light-emitting element of claim 1, further comprising a first conductive pad and a second conductive pad, wherein the multi-layer light-emitting structure comprises an n-type semiconductor layer, a p-type semiconductor layer, and an active layer disposed between the n-type semiconductor layer and the p-type semiconductor layer, and the first conductive pad is electrically connected to the n-type semiconductor layer, the second conductive pad is electrically connected to the p-type semiconductor layer, wherein the first conductive pad, the second conductive pad, and the second reflection layer are disposed on a same side of the first reflection layer.

10. The light-emitting element of claim 1, wherein the upper light-extracting surface comprises a corrugated surface.

11. The light-emitting element of claim 1, wherein the light-transmitting semiconductor layer has a same material as the multi-layer light-emitting structure.

12. A light-emitting element, comprising:
   a first reflection layer having a first reflectance;
   a second reflection layer having a second reflectance greater than the first reflectance;
   a multi-layer light-emitting structure disposed between the first reflection layer and the second reflection layer; and
   a light-transmitting semiconductor layer disposed on the first reflection layer and having an upper light-extracting surface, wherein the first reflection layer is closer to the upper light-extracting surface than the second reflection layer, an interval between the upper light-extracting surface and the first reflection layer is equal to or smaller than 5 μm, wherein the upper light-extracting surface comprises a plurality of cone-shaped portions.

13. The light-emitting element of claim 12, wherein an interval between the first and second reflection layers is equal to or smaller than 3 μm.

14. The light-emitting element of claim 12, wherein a ratio of a maximum vertical length of the multi-layer light-emitting structure to an interval between the first and second reflection layers is equal to or greater than 0.9, and the ratio is smaller than 1.

15. The light-emitting element of claim 12, wherein the second reflectance is greater than 95%, and the first reflectance ranges from 45% to 95%.

16. The light-emitting element of claim 12, wherein the second reflection layer comprises a Bragg reflector.

17. The light-emitting element of claim 16, wherein the first reflection layer comprises another Bragg reflector containing semiconductor material.

18. The light-emitting element of claim 12, wherein the second reflection layer comprises a metal reflection mirror.

19. The light-emitting element of claim 18, wherein the first reflection layer comprises a Bragg reflector containing semiconductor material.

20. The light-emitting element of claim 12, further comprising a first conductive pad and a second conductive pad, wherein the multi-layer light-emitting structure comprises an n-type semiconductor layer, a p-type semiconductor layer, and an active layer disposed between the n-type semiconductor layer and the p-type semiconductor layer, and the first conductive pad is electrically connected to the n-type semiconductor layer, the second conductive pad is electrically connected to the p-type semiconductor layer, wherein the first conductive pad, the second conductive pad, and the second reflection layer are disposed on a same side of the first reflection layer.

* * * * *